US011495732B2

(12) United States Patent
Uebayashi et al.

(10) Patent No.: US 11,495,732 B2
(45) Date of Patent: Nov. 8, 2022

(54) PIEZOELECTRIC TRANSFORMER AND ELECTRONIC APPARATUS

(71) Applicant: CANON KABUSHIKI KAISHA, Tokyo (JP)

(72) Inventors: Akira Uebayashi, Tokyo (JP); Miki Ueda, Tokyo (JP); Takanori Matsuda, Chofu (JP); Makoto Kubota, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 520 days.

(21) Appl. No.: 16/598,930

(22) Filed: Oct. 10, 2019

(65) Prior Publication Data

US 2020/0127188 A1 Apr. 23, 2020

(30) Foreign Application Priority Data

Oct. 17, 2018 (JP) .............................. JP2018-195965

(51) Int. Cl.
*H01L 41/107* (2006.01)
*H01L 41/04* (2006.01)
*H01L 41/187* (2006.01)
*H01L 41/083* (2006.01)
*H01L 41/053* (2006.01)

(52) U.S. Cl.
CPC .......... *H01L 41/107* (2013.01); *H01L 41/044* (2013.01); *H01L 41/0533* (2013.01); *H01L 41/083* (2013.01); *H01L 41/1871* (2013.01); *H01L 41/1873* (2013.01)

(58) Field of Classification Search
CPC . H01L 41/107; H01L 41/044; H01L 41/0533; H01L 41/083; H01L 41/1871; H01L 41/1873
See application file for complete search history.

(56) References Cited

U.S. PATENT DOCUMENTS 5,576,590 A * 11/1996 Ohnishi ................ H01L 41/107
310/366
6,353,278 B1 * 3/2002 Fujii ..................... H01L 41/107
310/358
6,756,238 B2 * 6/2004 Ogawa ................. H01L 41/1875
438/30
2002/0011986 A1 1/2002 Hasegawa et al.
(Continued)

FOREIGN PATENT DOCUMENTS

EP 0103304 A2 * 3/1984
JP S51-123592 A 10/1976
(Continued)

*Primary Examiner* — J. San Martin
(74) *Attorney, Agent, or Firm* — Canon U.S.A., Inc., IP Division

(57) ABSTRACT

A piezoelectric transformer comprises at least a laminate of a first member, a first piezoelectric element, a second piezoelectric element and a second member sequentially stacked one on the other in the above-listed order and a pressurizing mechanism for squeezing the first member and the second member together in the stacking direction. The ratio of the electromechanical coupling coefficient $k_{33}$ relative to the electromechanical coupling coefficient $k_{31}$ ($k_{33}/k_{31}$) of the first piezoelectric element and the second piezoelectric element is not less than 2.0.

17 Claims, 9 Drawing Sheets

(56) References Cited

U.S. PATENT DOCUMENTS

2014/0167571 A1\* 6/2014 Meyer ................... H01L 41/107
                                                                             310/366
2015/0179921 A1\* 6/2015 Asano ................. H01L 41/0472
                                                                             310/357

FOREIGN PATENT DOCUMENTS

| JP | H08-330643 | A |   | 12/1996 |
|----|------------|---|---|---------|
| JP | 09186373   | A | \* | 7/1997  |
| JP | 09205029   | A | \* | 8/1997  |

\* cited by examiner

PIEZOELECTRIC TRANSFORMER AND ELECTRONIC APPARATUS

BACKGROUND OF THE INVENTION

Field of the Invention

The present disclosure relates to a piezoelectric transformer showing a high degree of power conversion efficiency. The present disclosure also relates to an electronic apparatus having such a piezoelectric transformer.

Description of the Related Art

Piezoelectric transformers are known as electronic parts operating for voltage conversions of voltage boosting and voltage bucking in electronic apparatuses. Among others, a piezoelectric transformer designed to realize a high power output as described below is known. Namely, there has been proposed a piezoelectric transformer (rod composite piezoelectric transformer) having a configuration such that a piezoelectric element formed by using polarized piezoelectric ceramics and a plurality of electrodes that are stacked is made to operate as input/output sections and the input section and the output section are laid one on the other and sandwiched between cylindrical metal pillars (Japanese Patent Application Laid-Open No. S51-123592). As an alternating voltage is applied as electric energy to the input section of such a piezoelectric transformer, the electric energy is transformed into elastic energy by the reverse piezoelectric effect of the piezoelectric ceramics of the input section. The elastic energy is then transmitted to the piezoelectric ceramics of the output section by way of the metal pillars and transformed back into electric energy by the direct piezoelectric effect of the piezoelectric ceramics of the output section, which electric energy is then taken out from the output section. In short, it is so arranged that a voltage is applied to the input section and the voltage generated at the output section by way of mechanical vibrations is taken out. In a piezoelectric transformer having the above-described configuration, the above-described direction of transmission of elastic energy corresponds to the 33 direction of a piezoelectric element. When mutually intersecting three spatial axes (e.g., xyz axes) are denoted respectively as the 1st axis, the 2nd axis and the 3rd axis and the polarization direction is made to agree with the direction of the 3rd axis, the 33 direction of a piezoelectric element refers to a vibration mode in the direction of the 3rd axis.

SUMMARY OF THE INVENTION

A piezoelectric transformer in the first aspect of the present disclosure is a piezoelectric transformer comprising at least a laminate of a first member, a first piezoelectric element, a second piezoelectric element and a second member sequentially stacked in this order and a pressurizing mechanism for squeezing the first member and the second member of the laminate together in the stacking direction, the ratio of the electromechanical coupling coefficient $k_{33}$ relative to the electromechanical coupling coefficient $k_{31}$ ($k_{33}/k_{31}$) of the first piezoelectric element and the second piezoelectric element being not less than 2.0.

A piezoelectric transformer in the second aspect of the present disclosure is a piezoelectric transformer comprising at least a laminate of a first member, a first piezoelectric element, a second piezoelectric element and a second member sequentially stacked in this order and a pressurizing mechanism for squeezing the first member and the second member of the laminate together in the stacking direction, the electromechanical coupling coefficient $k_{31}$ of the first piezoelectric element and the second piezoelectric element being less than 30%, the electromechanical coupling coefficient $k_{33}$ of the first piezoelectric element and the second piezoelectric element being not less than 50%.

An electronic apparatus of the present disclosure comprises a piezoelectric transformer as defined above.

Further features of the present disclosure will become apparent from the following description of exemplary embodiments with reference to the attached drawings.

DESCRIPTION OF THE EMBODIMENTS

In a piezoelectric transformer (rod composite piezoelectric transformer) designed to realize a high power output as described in Japanese Patent Application Laid-Open No. S51-123592, not only vibrations in the 33 direction, which act to produce elastic energy, but also vibrations in the 31 direction are generated at the input section. As a result of such vibrations in the 31 direction, heat is generated along the interfaces of the piezoelectric ceramics and the peripheral members such as the electrode plates and the metal pillars to in turn give rise to disadvantages such as vibration transmission losses and consequent degradation of the power conversion efficiency. Additionally, while downsizing of electronic parts is required for the purpose of high integration in the insides of electronic apparatuses, heat generation in piezoelectric transformers are accompanied by disadvantages of temperature rises at peripheral parts and peripheral members that adversely affect the efforts for downsizing and high integration.

In view of the above-identified disadvantages, the present disclosure provides a piezoelectric transformer designed to realize a high power output (rod composite piezoelectric transformer) and having a high degree of conversion efficiency between the input power and the output power by minimizing the heat generation along the interfaces of the piezoelectric ceramics and the peripheral members such as the electrode plates and the metal pillars.

Thus, there is provided a piezoelectric transformer showing a high degree of power conversion efficiency in high power output operations. There is also provided an electronic apparatus showing a high degree of power conversion efficiency realized by using such a piezoelectric transformer.

Now, embodiments of piezoelectric transformer and those of electronic apparatus having such a piezoelectric transformer will be described below.

Configuration of Piezoelectric Transformer

Figure 1A:
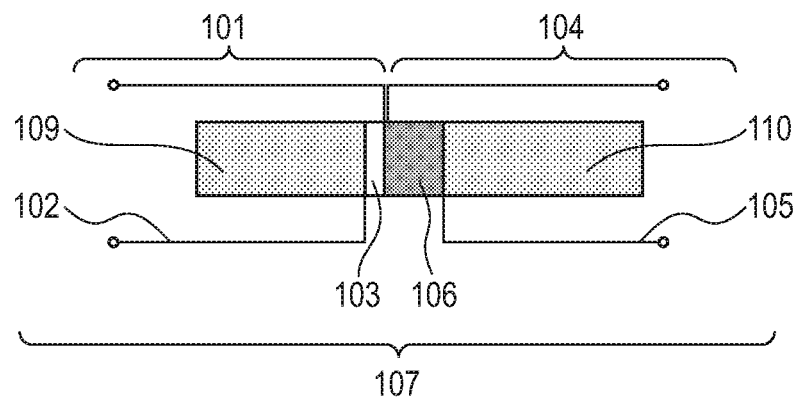
FIGS. 1A and 1B schematically illustrate two alternative configurations of an embodiment of piezoelectric transformer of the present disclosure.
Figure 1B:
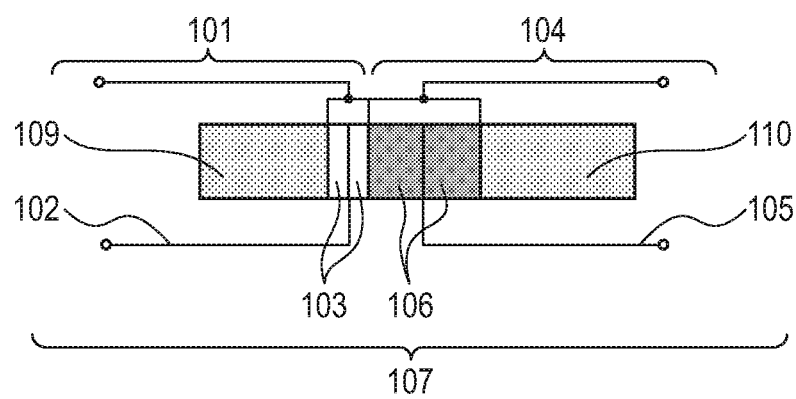

FIGS. 1A and 1B are schematic illustrations of an embodiment of piezoelectric transformer of the present disclosure having two alternative configurations. The embodiment of piezoelectric transformer illustrated in FIG. 1A is a piezoelectric transformer 107 comprising a first piezoelectric element 103, which is a piezoelectric element for power inputs, and a second piezoelectric element 106, which is a piezoelectric element for power outputs, the first and second piezoelectric elements 103, 106 being sandwiched between a first member 109 and a second member 110. Each of the first piezoelectric element and the second piezoelectric element is formed by using polarized piezoelectric ceramics and a plurality of electrodes, which ceramics and electrodes are stacked in the direction same as the stacking direction of the first member and the second member, and the direction of polarization of the piezoelectric ceramics is also the same as the stacking direction of the above-listed members. A simple electrode for polarization processing may be bonded to the piezoelectric ceramics. Alternatively, a pair of first piezoelectric elements 103 may be arranged side by side with same poles facing each other and also a pair of second piezoelectric elements 106 may be arranged side by side with same poles facing each other such that the two pairs of piezoelectric elements are sandwiched between a first member 109 and a second member 110 as shown in FIG. 1B.

The first member 109 and the second member 110 may, for example, be cylindrical metal pillars, although the material and the profile of the first and second members 109, 110 are not subject to any particular limitations so long as they can sandwich the first piezoelectric element 103 and the second piezoelectric element 106 between them. As an alternating voltage is applied to the input terminal 102 of the input section 101 of the piezoelectric transformer 107 as electric energy, the electric energy is transformed into elastic energy by the reverse piezoelectric effect of the piezoelectric element 103 for power inputs. The elastic energy is then transformed back into electric energy by the direct piezoelectric effect of the piezoelectric element 106 for power outputs of the output section 104, which electric energy is then taken out from the output terminal 105. In short, it is so arranged that a voltage is applied to the input section 101 and the voltage generated at the output section 104 by way of mechanical vibrations is taken out.

Each of the piezoelectric elements of the present disclosure comprises a plurality of electrodes and a piezoelectric ceramics. The electrodes and the piezoelectric ceramics may be bonded to each other or may alternatively and simply be laid one on the other.

Figure 2A:
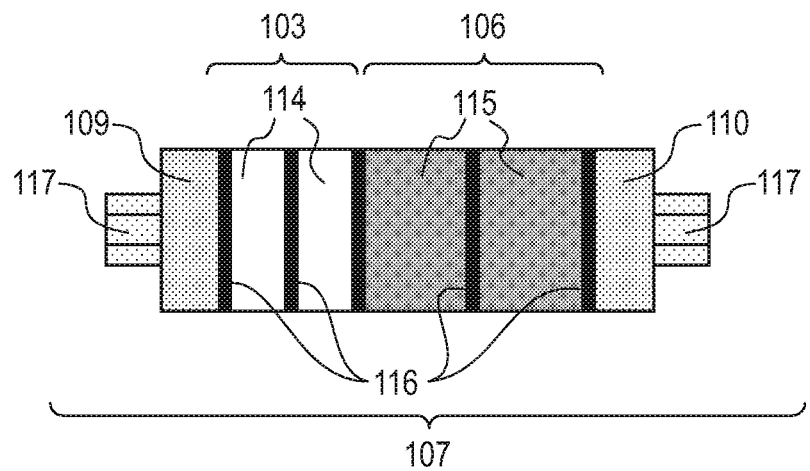
FIGS. 2A, 2B, 2C, 2D and 2E schematically illustrate pressurizing mechanisms having different respective configurations that can be used for a piezoelectric transformer of the present disclosure.
Figure 2B:
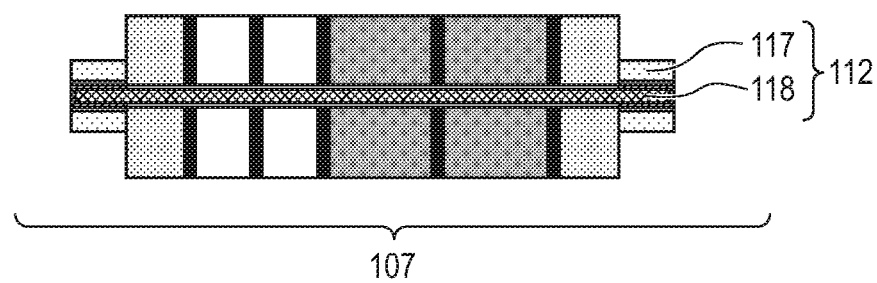

The profile of the piezoelectric transformer 107 of the present disclosure may, for example, be cylindrical, having an outer diameter of R, with a through hole of an inner diameter of r for allowing a bolt to pass through it or without such a through hole. The fracture endurance of the piezoelectric elements of the piezoelectric transformer against the pulling stress is improved by squeezing the structure from opposite ends by means of a pair of nuts and applying pressure to (pressurizing) the structure. Then, the power input to the piezoelectric transformer can be raised so as to allow the piezoelectric transformer to be operated with high power. FIGS. 2A through 2E are schematic illustrations of pressurizing mechanisms having different respective configurations that can be used for a piezoelectric transformer of the present disclosure. FIG. 2A shows a pressurizing mechanism where the first member and the second member are squeezed from opposite ends thereof by a pair of nuts and FIG. 2B is a schematic cross-sectional view of the arrangement of FIG. 2A. A shaft 118 is made to run through the inside of the piezoelectric transformer 107. Then, a through hole having an diameter greater than the diameter of the shaft 118 needs to be bored through the first member 109, the first piezoelectric element 103, the second piezoelectric element 106 and the second member 110.

Figure 2C:
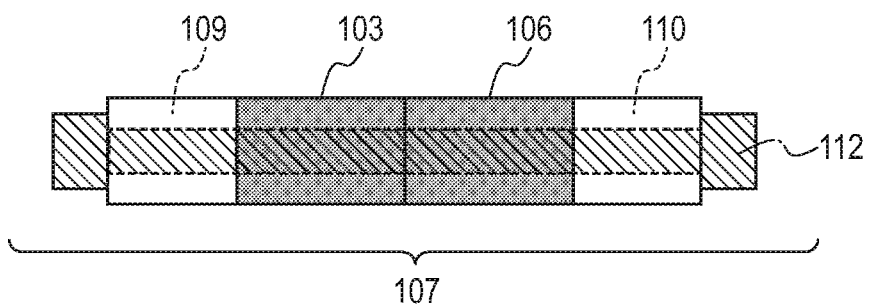
Figure 2D:
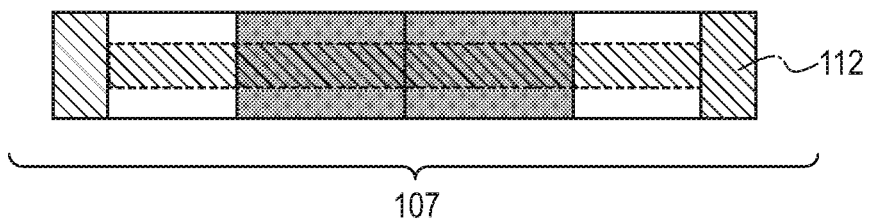

When the first piezoelectric element 103 having the shaft 118, the piezoelectric ceramics 114 and the electrodes 116 contacts the second piezoelectric element 106 having the piezoelectric ceramics 115 and the electrodes 116, the contact can obstruct the vibrations of the first piezoelectric element 103 and those of the second piezoelectric element 106. Therefore, space absolutely needs to be provided between the shaft 118 and the first piezoelectric element 103 and also between the shaft 118 and the second piezoelectric element 106. Additionally, short circuiting can happen when a metal-made shaft 118 is employed and brought into contact with the first piezoelectric element 103 and the second piezoelectric element 106. Meanwhile, pressure can be applied to the piezoelectric transformer 107 by threading the shaft 118 at surface areas thereof located at the opposite ends of the piezoelectric transformer 107 and squeezing the piezoelectric transformer 107 from the opposite ends by means of a pair of nuts 117. As means for pressurizing the piezoelectric transformer 107, a pressurizing mechanism 112 (shaded areas) that utilizes the through hole bored through a central part of the piezoelectric transformer 107 and squeezes the piezoelectric transformer 107 by means of a pair of threaded parts of the shaft that operate as bolts and a pair of nuts as shown in FIG. 2C may preferably be provided. Considerations for maintaining the intraplanar uniformity of the stress applied to the piezoelectric elements during the stretching vibrations that are utilized for elements driving operations as high as possible, for securing a high output efficiency performance and for improving the durability of the piezoelectric transformer are required when squeezing the piezoelectric transformer. In view of such considerations, the cross-sectional contour of each of the bolt heads and that of each of the nuts of the pressurizing mechanism 112 for squeezing the piezoelectric transformer 107 preferably transversally agree with that of the piezoelectric transformer 107 (FIG. 2D). A structure where the bolt heads and the nuts are buried in the pressurizing mechanism 112 (FIG. 2E) is also preferable because such a structure can downsize the piezoelectric transformer 107.

Resonance of stretching vibrations is utilized for driving the piezoelectric transformer 107. FIGS. 3A through 3D schematically illustrate the displacements and the stress distributions at the time of resonance of stretching vibrations in a stretch mode of the 1st order through a stretch mode of the 4th order with an arrangement where the opposite ends of the piezoelectric transformer is made to be free ends. A piezoelectric transformer having a high degree of conversion efficiency between the input power and the output power can be realized by arranging the input section and the output section at respective positions that maximize the stress at the time of resonance of stretching vibrations that is to be utilized for driving the piezoelectric elements. While an instance where the opposite ends of the piezoelectric transformer are made to be free ends is described above, a piezoelectric transformer having a high degree of conversion efficiency between the input power and the output power can also be realized by arranging the input section and the output section at respective positions that maximize the stress at the time of stretching resonance even with a structure where one of the opposite ends is made to be a fixed end or both of the opposite ends are made to be fixed ends.

The positions that maximize the stress at the time of stretching resonance of the piezoelectric transformer can be estimated, for example, by means of the finite element method. For example, "ANSYS" (trade name, available from ANSYS Inc.) is known as packaged software for the finite element method.

Figure 4A:
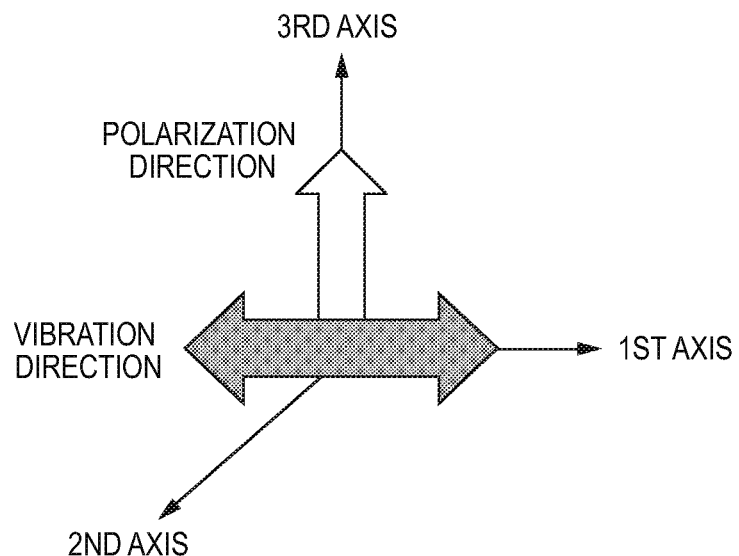
FIGS. 4A and 4B schematically illustrate the two different relationships between the polarization direction and the vibration direction of a piezoelectric element.
Figure 4B:
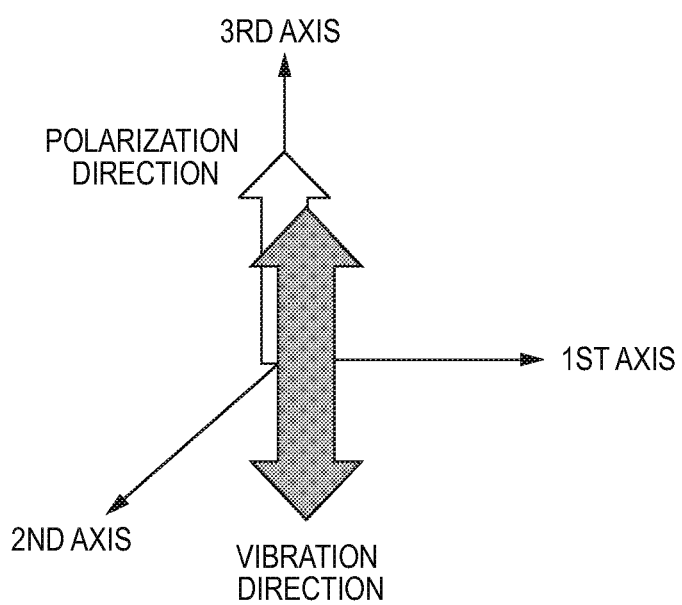

FIGS. 2A through 2E are illustrations of exemplar piezoelectric transformers of the present disclosure. To be more specific, a piezoelectric transformer of the present disclosure is a piezoelectric transformer comprising at least a laminate of a first member, a first piezoelectric element, a second piezoelectric element and a second member formed by stacking the above-described components in the above-listed order and a pressurizing mechanism for squeezing the first member and the second member of the laminate together in the stacking direction. Additionally, the piezoelectric transformer is characterized in that the ratio of the electromechanical coupling coefficient $k_{33}$ relative to the electromechanical coupling coefficient $k_{31}$ ($k_{33}/k_{31}$) of the first piezoelectric element and the second piezoelectric element is not less than 2.0. When the value of ($k_{33}/k_{31}$) is not less than 2.0, the frictional loss along the interfaces of the piezoelectric ceramics and the peripheral members such as the electrode plates and the metal pillars is reduced to minimize the generation of heat there. In short, a piezoelectric transformer of the present disclosure can be made to be a piezoelectric transformer that can efficiently transform vibration energy and hence have a high degree of conversion efficiency between the input power and the output power. An electromechanical coupling coefficient k is a quantity for expressing the magnitude of the piezoelectric effect that shows the efficiency of transforming electric energy into mechanical energy. When k has a large value, it means that the effect is remarkably great. Generally, electromechanical coupling coefficients can be computationally determined according to Standard EM-4501A of the Japan Electronics and Information Technology Industries Association (JEITA). Electromechanical coupling coefficient $k_{31}$ represents the effect of stretching vibration in the long side direction, which is a mode of vibration in the direction of the 1st axis relative to the polarization direction of the 3rd axis as shown in FIG. 4A. In the instance of a piezoelectric transformer of the present disclosure, it represents the effect of vibrations in the direction perpendicular to the stacking direction of the members. On the other hand, electromechanical coupling coefficient $k_{33}$ represents the effect of stretching vibration in the longitudinal direction, which is a mode of vibration in the 3rd axis relative to the polarization direction in the direction of the 3rd axis. In the instance of a piezoelectric transformer of the present disclosure, it represents the effect of vibrations in the stacking direction of the members.

FIGS. 2A through 2E are schematic illustrations of exemplar embodiments of piezoelectric transformer of the present disclosure. Each of the illustrated embodiments of piezoelectric transformer comprises at least a laminate formed by sequentially stacking a first member, a first piezoelectric element, a second piezoelectric element and a second member in the above-listed order and a pressurizing mechanism for squeezing the first member and the second member of the laminate together in the stacking direction. Additionally, a piezoelectric transformer of the present disclosure is characterized in that the electromechanical coupling coefficient $k_{31}$ of the first piezoelectric element and the second piezoelectric element is less than 30% and the electromechanical coupling coefficient $k_{33}$ of the first piezoelectric element and the second piezoelectric element is not less than 50%. When the electromechanical coupling coefficient $k_{31}$ is less than 30%, the frictional loss along the interfaces of the piezoelectric ceramics and the peripheral members such as the electrode plates and the metal pillars is reduced to minimize the generation of heat there. When, on the other hand, the electromechanical coupling coefficient $k_{33}$ is not less than 50%, the vibration energy that is generated at the input section and the output section when the piezoelectric transformer is driven to operate can be boosted. Then, the output power can also be boosted. Thus, a piezoelectric transformer that can efficiently transform vibration energy and shows a high output power and a high degree of conversion efficiency between the input power and the output power can be realized by making the electromechanical coupling coefficient $k_{31}$ less than 30% and the electromechanical coupling coefficient $k_{33}$ not less than 50%.

FIGS. 2A through 2E are schematic illustrations of exemplar embodiments of piezoelectric transformer of the present disclosure. Each of the illustrated embodiments of piezoelectric transformer comprises at least a laminate formed by sequentially stacking a first member, a first piezoelectric element, a second piezoelectric element and a second member in the above-listed order and a pressurizing mechanism for squeezing the first member and the second member of the laminate together in the stacking direction. Additionally, a piezoelectric transformer of the present disclosure is characterized in that the ratio of the electromechanical coupling coefficient $k_{33}$ relative to the electromechanical coupling coefficient $k_{31}$ ($k_{33}/k_{31}$) of the first piezoelectric element and the second piezoelectric element is not less than 2.0 and that the electromechanical coupling coefficient $k_{31}$ of the first piezoelectric element and the second piezoelectric element is less than 30% and the electromechanical coupling coefficient $k_{33}$ of the first piezoelectric element and the second piezoelectric element is not less than 50% in addition to that the above requirement of the ratio is satisfied. In short, the ratio of ($k_{33}/k_{31}$) is not less than 2.0 and the electromechanical coupling coefficient $k_{31}$ of the first piezoelectric element and the second piezoelectric element is less than 30% while the electromechanical coupling coefficient $k_{33}$ of the first piezoelectric element and the second piezoelectric element is not less than 50%. With the above-described arrangement, the frictional loss along the interfaces of the piezoelectric ceramics and the peripheral members such as the electrode plates and the metal pillars is reduced to minimize the generation of heat there. Additionally, the vibration energy that is generated at the input section and the output section when the piezoelectric transformer is driven to operate can be boosted. Then, the output power can also be boosted. Thus, a piezoelectric transformer that can efficiently transform vibration energy and shows a high output power and a high degree of conversion efficiency for output power relative to input power can be realized A piezoelectric transformer realized by considering the ratio of the electromechanical coupling coefficient $k_{33}$ relative to the electromechanical coupling coefficient $k_{31}$ ($k_{33}/k_{31}$) of the first piezoelectric element and the second piezoelectric element is not known to date.

The ratio of the electromechanical coupling coefficient $k_{33}$ relative to the electromechanical coupling coefficient $k_{31}$ ($k_{33}/k_{31}$) of the first piezoelectric element and the second piezoelectric element is preferably not less than 2.2, more preferably not less than 2.3.

Figure 3A:
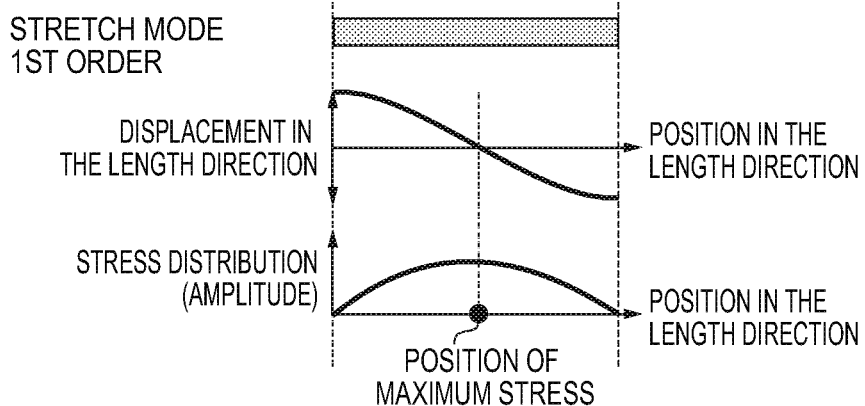
FIGS. 3A, 3B, 3C and 3D schematically illustrates combinations of a displacement distribution and a stress distribution at the time of stretching vibrations in different stretch modes (of the 1st, 2nd, 3rd and 4th orders) in a mechanical resonance of a structure.
Figure 3B:
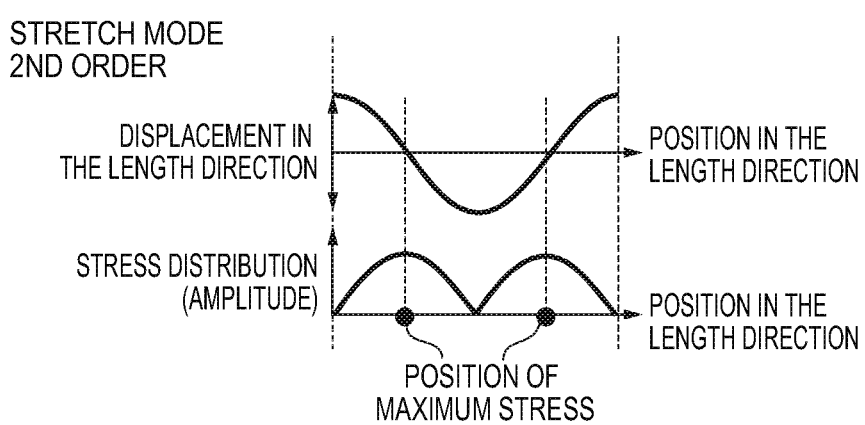
Figure 3C:
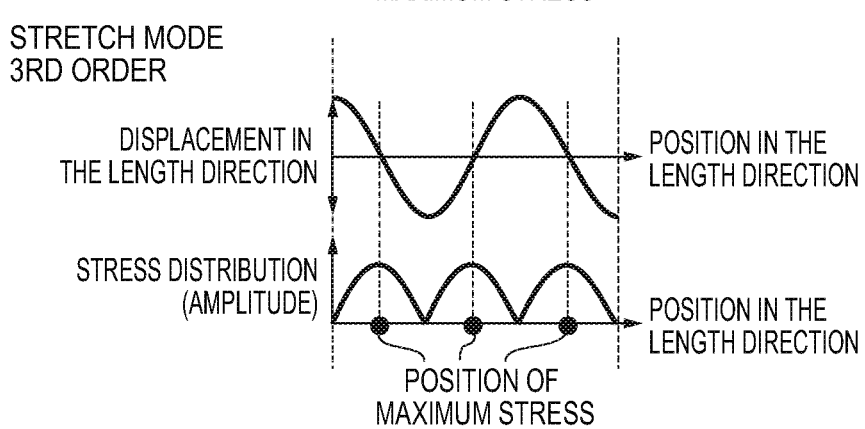
Figure 3D:
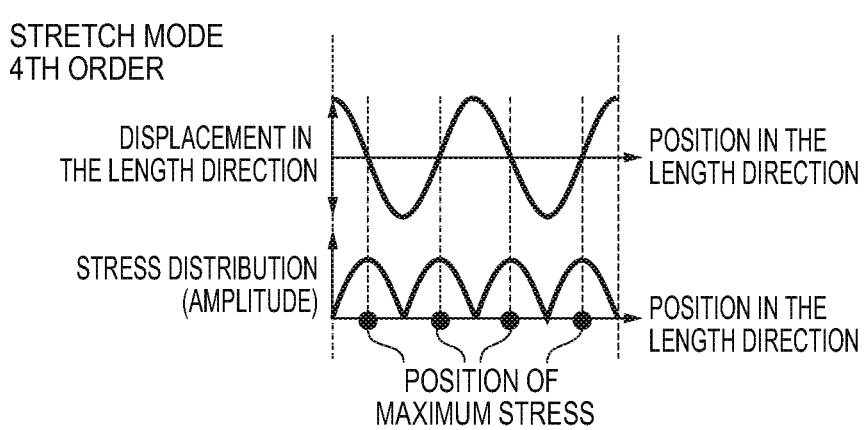

In a piezoelectric transformer of the present disclosure, a third member is preferably laid between the first piezoelectric element and the second piezoelectric element. When a third member is laid between the first piezoelectric element and the second piezoelectric element, for example, a stretch mode of the 2nd order as shown in FIG. 3B becomes available. In the stretch mode of the 2nd order, the piezoelectric element at the input side and the piezoelectric element at the output side can be arranged at respective positions that maximize their stresses. Then, it becomes possible to realize a piezoelectric transformer that shows a high degree of efficiency of power conversion.

Pressurizing Mechanism

In a piezoelectric transformer having a pressurizing mechanism of the present disclosure, the pressurizing mechanism preferably runs through the laminate of the piezoelectric transformer. Then, as shown in FIGS. 2A through 2E, the piezoelectric transformer can be made to show a structure where the pressurizing mechanism runs through the laminate and applies pressure from the opposite ends of the structure. With such an arrangement, the components of the piezoelectric transformer including the pressurizing mechanism can be made to become an integral resonator. Then, the vibration loss can be reduced to make the piezoelectric transformer show a high degree of efficiency of power conversion.

In a piezoelectric transformer of the present disclosure, the pressurizing mechanism is preferably buried in the laminate. As the pressurizing mechanism is buried in the laminate as shown in FIG. 2C, a high level of intraplanar uniformity of the stress applied to the piezoelectric elements during the stretching vibrations that are utilized for elements driving operations can be maintained. Such an arrangement is preferable because, as a result, the piezoelectric transformer is made to have improved durability and show a high degree of conversion efficiency between the input power and the output power. Additionally, a piezoelectric transformer in which the pressurizing mechanism is buried in the laminate is preferable from the viewpoint of downsizing.

In a piezoelectric transformer of the present disclosure, each of the piezoelectric elements is preferably formed by stacking an even number of plate-shaped piezoelectric ceramics and a plurality of electrodes. While each of the piezoelectric elements of the input section and the output section shown in FIG. 1A is formed by using a single plate-shaped piezoelectric ceramics, each of the piezoelectric elements of the input section and the output section shown in FIG. 1B is formed by using a pair of plate-shaped piezoelectric ceramics. When the same voltage is applied from the drive circuit, vibration energy is generated only by the single piezoelectric ceramics in the piezoelectric transformer of FIG. 1A whereas vibration energy is generated by the two piezoelectric ceramics in the piezoelectric transformer of FIG. 1B. Thus, a high power output piezoelectric transformer can be realized by forming each of the piezoelectric elements by stacking an even number of plate-shaped piezoelectric ceramics and a plurality of electrodes.

In a piezoelectric transformer of the present disclosure having a third member as described above, the third member is preferably an insulator. When the third member is an insulator, the input side circuit and the output side circuit are reliably insulated from each other. With such an insulated structure, the electricity on the input side is prevented from directly flowing into the output side and hence the circuit or circuits connected to the output side can be protected. Additionally, any situation where electricity is unexpectedly reversely transmitted from the output side to the input side can be prevented from taking place. For the above-described reasons, the third member is preferably an insulator.

Piezoelectric Element

The Young's modulus of each of the piezoelectric elements of a piezoelectric transformer of the present disclosure at room temperature is preferably not less than 100 GPa and not more than 200 GPa. Because the Young's modulus and the resonance frequency of a piezoelectric element are positively correlated, the resonance frequency rises as the Young's modulus is raised. In the manufacture of piezoelectric elements having a constant resonance frequency, piezoelectric elements having a large Young's modulus allows downsizing to a greater extent if compared with piezoelectric elements having a small Young's modulus. The Young's modulus of a piezoelectric element can be computationally determined from the sound velocity in the vibration mode in question and the density, of which the density can typically be measured by means of the Archimedes method.

The content rate of Pb (lead) ingredient of each of the piezoelectric elements of a piezoelectric transformer of the present disclosure is preferably less than 1,000 ppm. When piezoelectric elements are discarded as wastes and exposed to acid rain or some other harsh environment, the Pb ingredient contained in the piezoelectric ceramics of the piezoelectric elements can become dissolved and get into the surrounding soil. The risk that such Pb harms the ecosystem of the planet has been pointed out and warned. In view of such an adverse effect of the Pb ingredient of piezoelectric elements, the piezoelectric elements of a piezoelectric transformer of the present disclosure are preferably of a lead-free type. When the content rate of the Pb ingredient of a piezoelectric element is less than 1,000 ppm, the adverse effect of the Pb ingredient absorbed by the environment can be minimal and such a piezoelectric element can be regarded as of a lead-free type. The content ratio of lead can be evaluated by seeing the content ratio relative to the total weight of the piezoelectric ceramics of a piezoelectric element as determined typically by means of X-ray fluorescence analysis (XRF) or ICP emission spectroscopy.

Piezoelectric Ceramics

In this specification, the expression of "ceramics" refers to an agglomerate (also referred to as bulk) of crystal grains produced as a result of baking whose basic component is a metal oxide. Piezoelectric ceramics may contain one or more components that is or are processed after the baking. Note, however, that piezoelectric ceramics should contain neither powder nor slurry that is obtained by dispersing powder.

Preferably, a piezoelectric transformer of the present disclosure is formed by using perovskite type metal oxides. Perovskite type metal oxides show excellent piezoelectric characteristics and hence can be used to realize high output power piezoelectric transformers.

Perovskite-type metal oxides are generally expressed by chemical formula $ABO_3$. In a perovskite type metal oxide, elements A and B exist in the form of ions and take respective specific positions in each unit lattice, which positions are referred to as site A and site B. For example, if a unit lattice is a cubic unit lattice, element A is located at the apex of the cube and element B is located at the body center of the cube. Element O exists in the form a negative ion of oxygen and is located at the face center of the cube. As a unit lattice of a cube is warped in the direction of [001], [011] or [111], it is turned into a crystal lattice having a perovskite structure of cubic, orthorhombic or rhombohedral crystal.

In this disclosure, the molar ratio (A/B) of A (mol) of site A and B (mol) of site B of a metal oxide expressed by chemical formula $ABO_3$ is expressed by a. If the value of a is other than 1, it is within the scope of the present disclosure so long as the metal oxide has a perovskite structure as a main phase thereof.

While the molar ratio of the element at site B and element O is 1:3 in a metal oxide expressed by chemical formula $ABO_3$, if the ratio of the amounts of the elements is slightly shifted, for example within 1%, such a shifted ratio is also within the scope of the present disclosure so long as the metal oxide has a perovskite structure as a main phase thereof.

If the metal oxide has a perovskite structure or not can be determined typically by means of X-ray diffraction analysis or electron diffraction analysis of the piezoelectric ceramics containing the metal oxide. If the metal oxide has a perovskite structure as a main crystal phase thereof, the piezoelectric ceramics that contain the metal oxide may auxiliary have one or more other crystal phases.

The types of the compounds that the piezoelectric ceramics of a piezoelectric transformer of the present disclosure comprise are not subject to any particular limitations. For example, compounds that can be used for a piezoelectric transformer of the present disclosure include lead zirconate titanate (PZT), barium titanate, barium calcium titanate, bismuth sodium titanate, lead titanate, lithium niobate, potassium sodium niobate, bismuth ferrate and metal oxides containing any of the above-listed compounds as major component. In view of the adverse effect of the Pb ingredient on the environment, the piezoelectric ceramics of a piezoelectric transformer of the present disclosure are preferably of a lead-free type metal oxide. When the content rate of the Pb ingredient contained in a piezoelectric ceramics is less than 1,000 ppm, the adverse effect of the Pb ingredient that is dissolved and absorbed by the environment will be minimal and hence such piezoelectric ceramics can be regarded as of a lead-free type.

Composition of Piezoelectric Ceramics

The piezoelectric ceramics of a piezoelectric transformer of the present disclosure preferably contain Ba and Ti. Barium titanate is an example of perovskite-type metal oxide containing Ba and Ti. The piezoelectric constant d of piezoelectric ceramics containing barium titanate as principal component shows a large absolute value. Therefore, the voltage that is required to obtain the same distortion amount can be reduced by using piezoelectric ceramics containing barium titanate as principal component. Then, a piezoelectric transformer showing an excellent power conversion efficiency performance can be realized by using such a piezoelectric ceramics.

The piezoelectric constant of a piezoelectric ceramics can be determined by measuring the density, the resonance frequency and the anti-resonance frequency of the piezoelectric ceramics and computing the piezoelectric constant according to Standard EM-4501A of the Japan Electronics and Information Technology Industries Association (JEITA). The resonance frequency and the anti-resonance frequency can typically be determined by arranging a pair of electrodes on the ceramics and subsequently using an impedance analyzer.

The piezoelectric ceramics of a piezoelectric transformer of the present disclosure preferably and additionally contain Ca and Zr. When the piezoelectric ceramics contain Ca, both the phase transition temperature from cubic to orthorhombic (to be simply referred to as Tto hereinafter) during a temperature fall and the phase transition temperature from orthorhombic to cubic (to be simply referred to as Tot hereinafter) during a temperature rise will be lowered. Additionally, when the piezoelectric ceramics contain Zr, both Tto and Tot will be boosted. Furthermore, the Curie temperature, which is the phase transition temperature from tetragonal to cubic (to be simply referred to as Tc hereinafter) will be lowered and the dielectric constant will be boosted so that the absolute value of the piezoelectric constant d will be increased. Therefore, the temperature stability of the piezoelectric characteristics can be improved by reducing the influence of the phase transition temperatures within the operating temperature range by making the piezoelectric ceramics contain Ca and Zr. Then, a piezoelectric transformer showing an excellent power conversion efficiency performance can be realized by using such piezoelectric ceramics.

The Curie temperature Tc is a temperature at and above which the piezoelectric properties of piezoelectric materials disappear in general. In this specification, the temperature at which the dielectric constant is maximized near the phase transition temperature from a ferroelectric phase (tetragonal phase) to a paraelectric phase (cubic phase) is expressed as Tc. Tc of a piezoelectric material prepared by using metal oxides containing barium titanate as principal components is found somewhere between 100° C. and 130° C.

The piezoelectric ceramics of a piezoelectric transformer of the present disclosure preferably show a composition ratio as defined below. The molar ratio x of Ca relative to the sum of Ba and Ca is defined as $0.02 \leq x \leq 0.30$ and the molar ratio y of Zr relative to the sum of Ti and Zr is defined as $0.020 \leq y \leq 0.095$, while the relationship between x and y is defined as $y \leq x$. Thus, it is more preferable for the piezoelectric ceramics that the value of x is not smaller than 0.02 because the temperature dependency of the piezoelectric constant of the piezoelectric ceramics is reduced when x is not smaller than 0.02. On the other hand, the tendency of becoming solid solution of Ca is encouraged to make it possible to lower the baking temperature when x is smaller than 0.30. Additionally, it is more preferable for the piezoelectric ceramics that the value of y, which is the molar ratio of Zr relative to the sum of Ti and Zr, is $0.020 \leq y \leq 0.095$. The piezoelectric constant of the piezoelectric ceramics is raised within the operating temperature range (e.g. between −30° C. and 60° C.) when the value of y is not smaller than 0.02. On the other hand, the value of Tc is raised typically to not lower than 100° C. to further minimize the depolarization during the operation of the piezoelectric transformer at high temperatures when the value of y is not greater than 0.095. Then, consequently, the guaranteed operating temperature range of the piezoelectric device is further broadened and the degradation with time of the piezoelectric constant is alleviated.

Thus, a piezoelectric transformer of the present disclosure can be made to have a piezoelectric constant whose temperature dependency is minimized and whose value is boosted to realize an excellent power conversion efficiency performance by defining x and y as $0.02 \leq x \leq 0.30$, $0.020 \leq y \leq 0.095$ and $y \leq x$.

Preferably, the piezoelectric ceramics of a piezoelectric transformer of the present disclosure are made of a piezoelectric material containing Mn, whose content ratio relative to 100 parts by weight of the above-cited oxides is not less than 0.02 parts by weight and not more than 0.40 parts by weight in terms of metallic Mn.

It is more preferable for the piezoelectric ceramics of a piezoelectric transformer of the present disclosure that the content ratio of Mn is within the range between not less than 0.02 parts by weight and not more than 0.40 parts by weight in terms of metallic Mn because the value of Qm can be increased at room temperature when the Mn content ratio is found within the above range. Generally, Qm is a coefficient expressing the elastic loss due to vibrations when the piezoelectric material is evaluated as vibrator and the magnitude of Qm is observed as sharpness of the resonance curve in an impedance measurement. In other words, Qm is a constant for expressing sharpness of resonance of the vibrator. The energy loss during vibrations is small when Qm has a large value. When the piezoelectric material is used as piezoelectric element and driven to vibrate by applying a voltage, the piezoelectric element can be made to efficiently operate with a small energy loss by improving the value of Qm. The value of Qm can be determined by means of a measurement according to Standard EM-4501A of the Japan Electronics and Information Technology Industries Association (JEITA).

Mn has a property of shifting its atomic valence between 2 and 4 and takes a role of compensating for the defect, if any, in the charge balance of piezoelectric ceramics. It may be safe to assume that the oxygen vacancy concentration in the crystal lattice of the piezoelectric ceramics is boosted and the residual stress that appears due to domain switching of the non-180 degrees domain is reduced to consequently raise the value of Qm by making the Mn content ratio be not less than 0.02 parts by weight. On the other hand, the tendency of becoming solid solution of Mn is boosted to further raise the insulation resistance by making the Mn content ratio be not more than 0.40 parts by weight. Such improved insulation is preferable because, when the piezoelectric material is employed as piezoelectric element and driven to vibrate by applying a voltage, the long term reliability of the piezoelectric element is secured.

For the purpose of the present disclosure, Mn may not necessarily be metal Mn and it is sufficient for the piezoelectric ceramics to contain Mn as one of its components. The mode of containing Mn of the piezoelectric ceramics does not matter. For example, Mn may exist at site B as solid solution or alternatively be contained in the piezoelectric ceramics at grain boundaries. Still alternatively, Mn may be contained in the piezoelectric ceramics in the form of metal, ions, an oxide, a metal Mn salt, a complex or the like. More preferably, Mn may be found as a preferable existence in the piezoelectric ceramics from the viewpoint of insulation and easy sintering. Generally, Mn can take a valence number of 4+, 3+ or 2+ and when the valence number of Mn is smaller than 4+, Mn operates as acceptor. When Mn exists as an acceptor in a crystal having a perovskite structure, oxygen vacancies are formed in the crystal. The Qm of the piezoelectric ceramics can be improved when the oxygen vacancies form defective dipoles. For Mn to exist with a valence number smaller than 4+, preferably a trivalent element exists at site A. A preferable trivalent element is Bi. Meanwhile, the valence number of Mn can be determined by observing the temperature dependency of the magnetic susceptibility of Mn.

Piezoelectric ceramics of a piezoelectric transformer of the present disclosure preferably contain Na and Nb. For example, a solid solution of sodium niobate ($NaNbO_3$) and barium titanate ($BaTiO_3$) (which will be referred to as NN-BT hereinafter) is known as piezoelectric ceramics containing Na and Nb. Since NN-BT practically does not contain potassium that can give rise to a hardly sinterable property and a lowly moisture-resistant property, it provides an advantage that the piezoelectric characteristics of the piezoelectric ceramics practically do not alter with time. Additionally, when NN-BT is employed for a piezoelectric transformer, the operating temperature range of the piezoelectric transformer (e,g., between 0° C. and 80° C.) does not include any phase transition point (temperature) that causes a phase transition of a crystal structure to take place, and hence, it also provides an advantage that the performance of the piezoelectric transformer does not remarkably fluctuate regardless of the operating temperature.

Electronic Apparatus

Figure 9A:
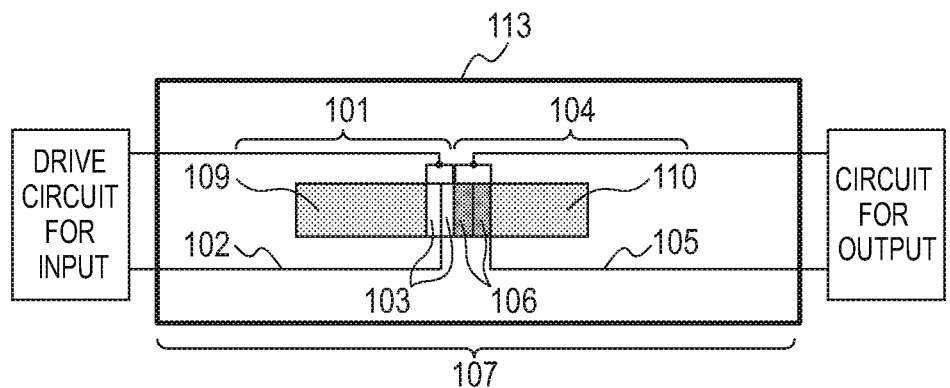
FIGS. 9A and 9B schematically illustrate two piezoelectric transformer devices respectively comprising the piezoelectric transformer of FIG. 5A and that of FIG. 5B.
Figure 9B:
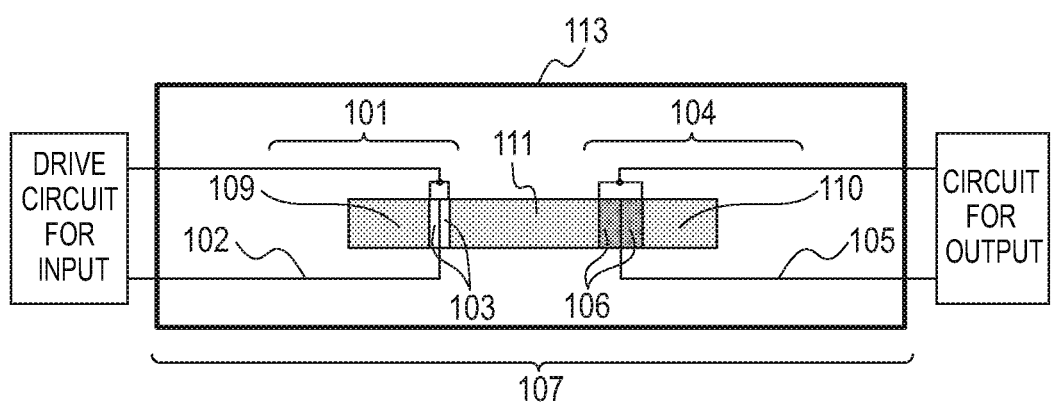

Preferably, a piezoelectric transformer of the present disclosure is provided with an external wall 113 to be incorporated in the electronic apparatus and connected to an input drive circuit and an output circuit (external load) for use as shown in FIGS. 9A and 9B. Since a piezoelectric transformer of the present disclosure can operate for a high power output for a high conversion efficiency performance, it can be downsized more than any other piezoelectric transformers and hence an electronic apparatus realized by incorporating such a piezoelectric transformer can also be downsized.

EXAMPLES

Now, a piezoelectric transformer of the present disclosure will be described more specifically by way of examples. However, it should be noted here that the examples that will be described below do not limit the scope of the present disclosure by any means.

Piezoelectric Ceramics

Two types of polarized PZT (lead titanate zirconate), two types of NN-BT (solid solutions of sodium niobate and a small amount of barium titanate) and a type of BCTZ-Mn (barium titanate to which Ca, Zr and Mn were added) were prepared as piezoelectric ceramics. The two types of PZT will be referred to as PZT_1 and PZT_2 and the two types of NN-BT will be referred to as NN-BT_1 and NN-BT_2 hereinafter. The densities of the prepared piezoelectric ceramics were measured by means of the Archimedes method. The concentration of each of the impurity elements contained in each of the piezoelectric ceramics of the two types of NN-BT and the piezoelectric ceramics of BCTZ-Mn by means of semi-quantitative analysis involving the use of GDMS (glow discharge mass spectrometry) to find that the piezoelectric ceramics contained Pb to a content rate of less than 50 ppm.

In each of the examples and the comparative example, the electromechanical coupling coefficient $k_{31}$, the electromechanical coupling coefficient $k_{33}$, the ratio of the electromechanical coupling coefficients $k_{33}/k_{31}$, the frequency constant $N_{31}$ and the Young's modulus $Y_{11}$ of the prepared samples of piezoelectric ceramics were evaluated as basic piezoelectric characteristics. For the purpose of the evaluation of the basic piezoelectric characteristics, a 400 nm-thick gold (Au) electrode was formed on the front surface and also on the back surface of each of the piezoelectric ceramics by means of DC sputtering. Additionally, a 30 nm-thick titanium (Ti) layer was formed as adhesion layer between each of the pair of electrodes and the piezoelectric ceramics carrying the electrodes. Subsequently, one of the samples of the piezoelectric ceramics was machined into a rectangular prism having a length of 0.9 mm, a width of 0.9 mm and a height of 4.9 mm and the electromechanical coupling coefficients $k_{33}$ of the prism were determined according to Standard EM-4501A of the Japan Electronics and Information Technology Industries Association (JEITA). Additionally, according to the same standard, another one of the samples of the piezoelectric ceramics was machined into a rectangular plate having a length of 10 mm, a width of 2.5 mm and a thickness of 0.5 mm to determine the electromechanical coupling coefficient $k_{31}$ and the resonance frequency of the plate. An impedance analyzer was used to determine the resonance frequency. The frequency constant $N_{31}$ and the Young's modulus $Y_{11}$ were computationally determined by using the observed value of the density and that of the resonance frequency of the sample. Table 1 shows the basic piezoelectric characteristics of the piezoelectric ceramics.

TABLE 1

|  | PZT_1 | PZT_2 | NN-BT_1 | NN-BT_2 | BCTZ-Mn |
|---|---|---|---|---|---|
| $k_{31}$ (%) | 11 | 37 | 23 | 26 | 26 |
| $k_{33}$ (%) | 36 | 67 | 53 | 54 | 58 |
| $k_{33}/k_{31}$ | 3.3 | 1.8 | 2.3 | 2.1 | 2.2 |
| $N_{31}$ (Hz · m) | 1890 | 1380 | 2570 | 2610 | 2210 |
| $Y_{11}$ (GPa) | 111 | 60 | 123 | 122 | 116 |

Preparation of Piezoelectric Transformer

Structure 1

Figure 5A:
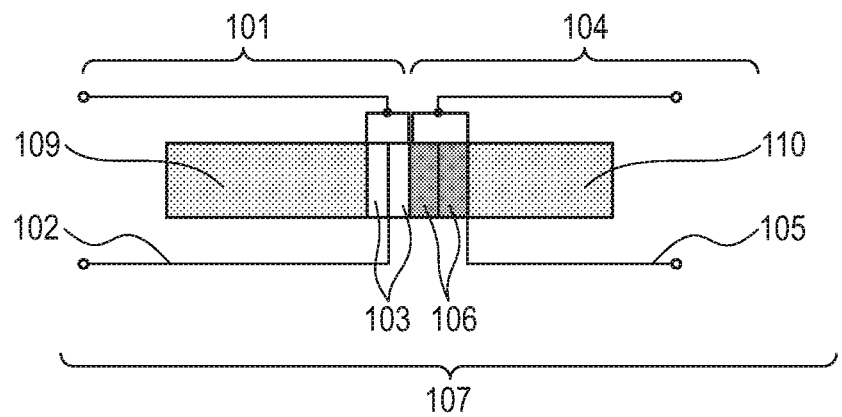
FIGS. 5A and 5B schematically illustrate two alternative configurations of another embodiment of piezoelectric transformer of the present disclosure.

As structure 1, a piezoelectric transformer 107 was prepared by laminating an input section 101 and an output section 104 as shown in FIG. 5A. The input section 101 included a first member 109, a first piezoelectric element (piezoelectric element for input) 103 and an input terminal 102, of which the input terminal 102 was connected to an electrode that belonged to the first piezoelectric element 103. On the other hand, the output section 104 included a second member 110, a second piezoelectric element (piezoelectric element for output) 106 and an output terminal 105, of which the output terminal 105 was connected to an electrode that belonged to the second piezoelectric element 106. SUS was employed for both the first member 109 and the second member 110. Each of the first piezoelectric element 103 and the second piezoelectric element 106 was formed by laminating a pair of plate-shaped piezoelectric ceramics, to which a simple electrode for polarization processing had been bonded, and three 0.2 mm-thick copper plates (not shown) to be used as electrode. A total of five copper plates were used as common electrode between the input section and the output section. The first member of the piezoelectric transformer 107 had a diameter of 13 mm and a length of 29.7 mm and the piezoelectric ceramics of the first piezoelectric element 103 and that of the second piezoelectric element 106 had a diameter of 13 mm and a length of 2.5 mm, whereas the second member 110 had a diameter of 13 mm and a length of 24.3 mm and the total length was made to be equal to 65 mm. A through hole having an inner diameter of 6 mm was bored through each of the components of the piezoelectric transformer 107 in order to arrange a pressurizing mechanism there and apply pressure from opposite ends of the structure of the piezoelectric transformer 107. An SUS-made shaft was made to run through the through hole. The opposite ends of the shaft were positionally rigidly secured by means of nuts and the piezoelectric transformer was squeezed by the nuts with a torque of 10 N·m.

Figure 6A:
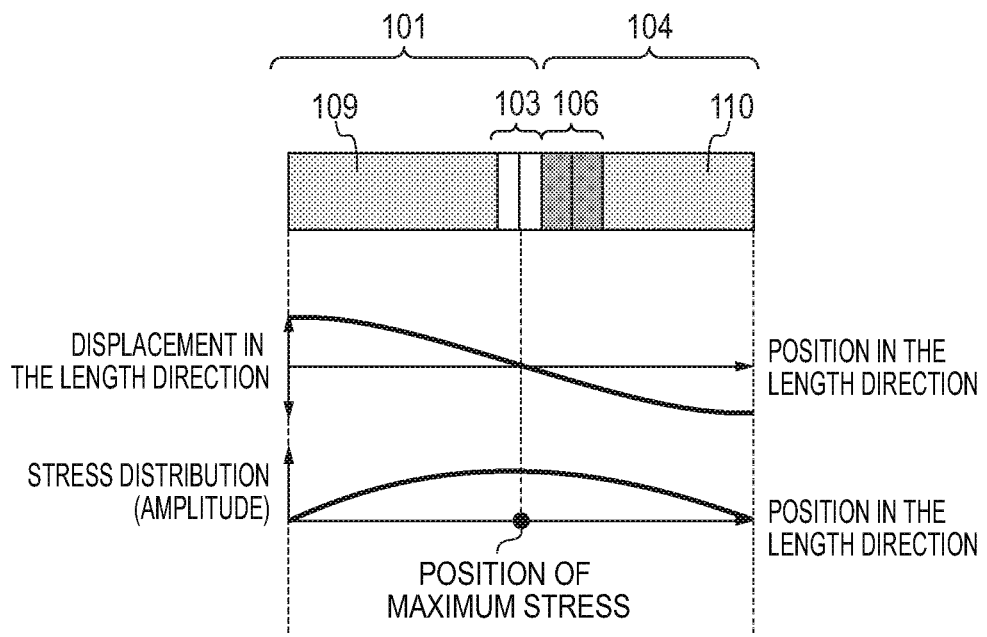
FIG. 6A schematically illustrates the relationship between the displacement distribution and the stress distribution at the time of stretching vibrations at the input section and the output section of the piezoelectric transformer of FIG. 5A and FIG. 6B schematically illustrates of the corresponding relationship of the piezoelectric transfer of FIG. 5B.

FIG. 6A schematically illustrates the amount of displacement and the relationship between the input section 101 and the output section 104 during primary stretching vibrations of the above-described arrangement. The opposite ends of the piezoelectric transformer were left as free ends and the center position of the first piezoelectric element 103 of the input section 101 was made to be the position where the absolute value of the displacement during primary stretching vibrations is equal to 0 and hence where the stress showed the greatest value.

Structure 2

Figure 5B:
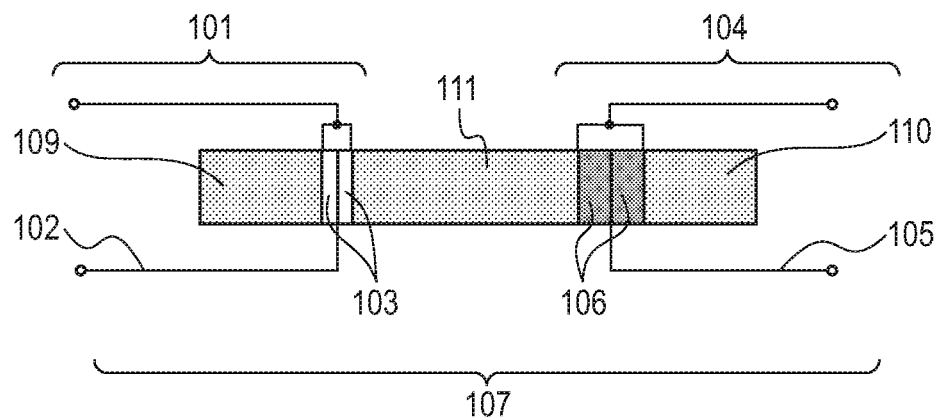

As structure 2, a piezoelectric transformer 107 was prepared by laminating an input section 101, a third member 111 and an output section 104 as shown in FIG. 5B. The input section 101 included a first member 109, a first piezoelectric element (piezoelectric element for input) 103 and an input terminal 102, of which the input terminal 102 was connected to an electrode that belonged to the first piezoelectric element 103. SUS was employed for the first member 109, the second member 110 and the third embodiment 111. On the other hand, the output section 104 included a second member 110, a second piezoelectric element (piezoelectric element for output) 106 and an output terminal 105, of which the output terminal 105 was connected to an electrode that belonged to the second piezoelectric element 106. Each of the first piezoelectric element 103 and the second piezoelectric element 106 was formed by laminating a pair of plate-shaped piezoelectric ceramics and three 0.2 mm-thick copper plates (not shown) to be used as electrode. A total of six copper plates were employed. The first member of the piezoelectric transformer 107 had a diameter of 15 mm and a length of 3.5 mm and the piezoelectric ceramics of the first piezoelectric element 103 and that of the second piezoelectric element 106 had a diameter of 15 mm and a length of 1.5 mm, whereas the second member 110 had a diameter of 15 mm and a length of 3.5 mm and the third member 111 had a diameter of 15 mm and a length of 7 mm. The total length of the piezoelectric transformer 107 was equal to 21 mm. A through hole having an inner diameter of 6 mm was bored through each of the components of the piezoelectric transformer 107 in order to arrange a pressurizing mechanism there and apply pressure from opposite ends of the structure of the piezoelectric transformer 107.

Figure 6B:
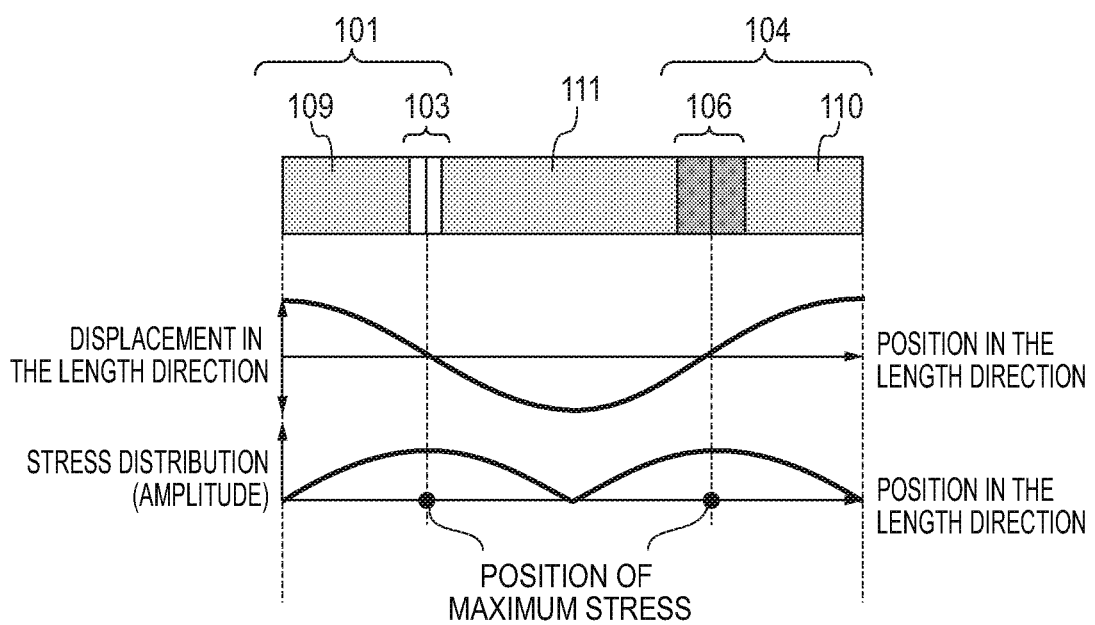

FIG. 6B schematically illustrates the amount of displacement and the relationship between the input section 101 and the output section 104 during primary stretching vibrations of the above-described arrangement. The opposite ends of the piezoelectric transformer were left as free ends, and the center position of the first piezoelectric element 103 of the input section 101 and the center position of the second piezoelectric element 106 of the output section 104 were made to be the positions where the absolute value of the displacement during secondary stretching vibrations is equal to 0 and hence where the stress showed the greatest value.

The piezoelectric transformers of Examples 1 through 5 and Comparative Example 1 as shown in Table 2 were prepared by using the piezoelectric ceramics shown in Table 1.

TABLE 2

|  | Piezoelectric Ceramics | Structure of Piezoelectric Transformer |
| --- | --- | --- |
| Comparative Example 1 | PZT_2 | Structure 1 |
| Example 1 | PZT_1 | Structure 1 |
| Example 2 | NN-BT_1 | Structure 1 |
| Example 3 | NN-BT_2 | Structure 1 |
| Example 4 | BCTZ-Mn | Structure 1 |
| Example 5 | NN-BT_1 | Structure 2 |

Evaluation of Characteristics of Piezoelectric Transformer

For each of the piezoelectric transformers shown in FIGS. 5A and 5B, and prepared in Examples and Comparative Example, an alternating voltage was applied to the input terminal 102 and the electric power output from the output terminal 105 was observed to evaluate the characteristics of the piezoelectric transformer. For each of the piezoelectric transformers, the power input was calculated by using the voltage and the electric current at the input terminal and the power output was calculated by using the voltage at the output terminal and the load resistance (not shown) connected to the output terminal. Then, the conversion efficiency of each of the piezoelectric transformer was determined from the ratio of the output power relative to the input power.

Figure 7:
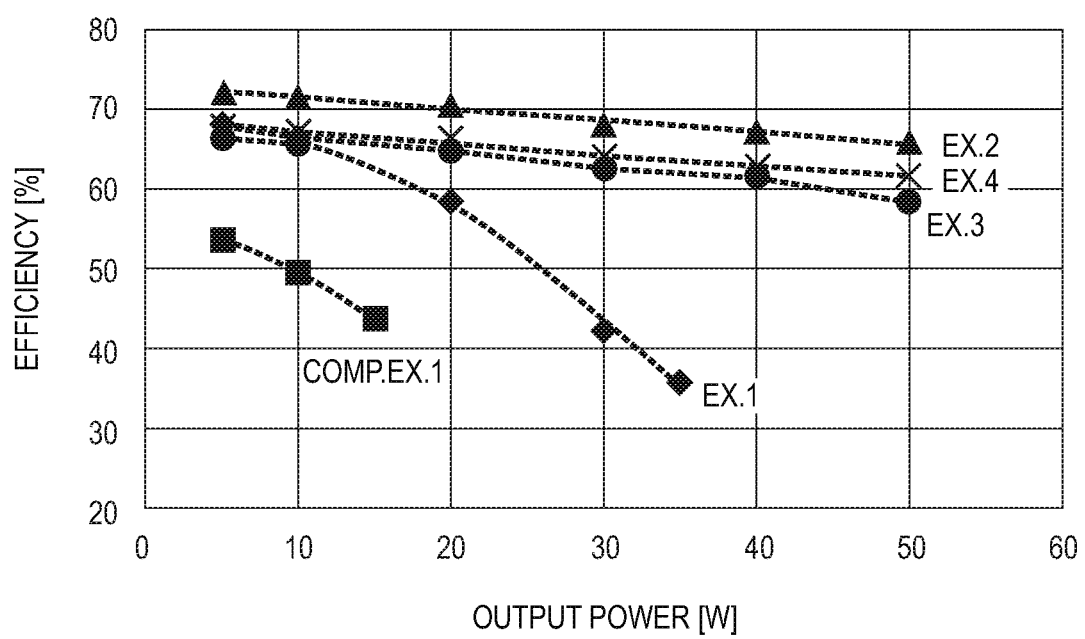
FIG. 7 schematically illustrates the relationship between the output power and the conversion efficiency between the input power and the output power as observed in each of Examples and Comparative Example.
Figure 8A:
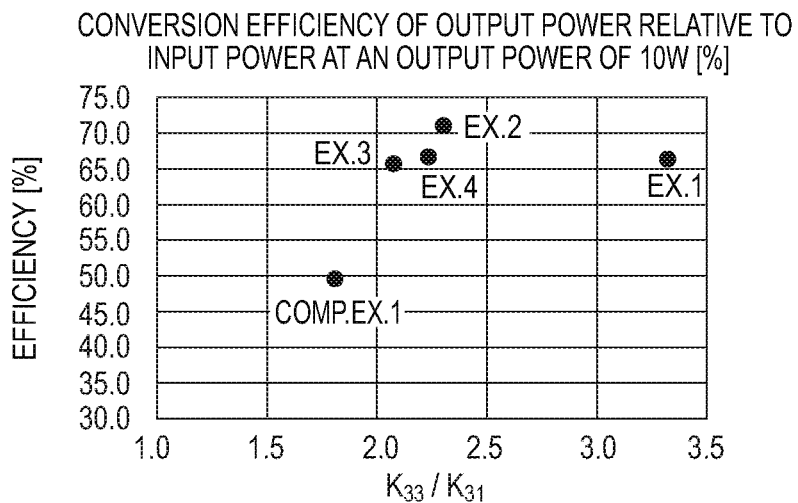
FIGS. 8A, 8B and 8C schematically illustrate the relationships between $k_{31}$ and $k_{33}$ and the conversion efficiency between the input power and the output power for different output powers as observed in Examples and Comparative Example.
Figure 8B:
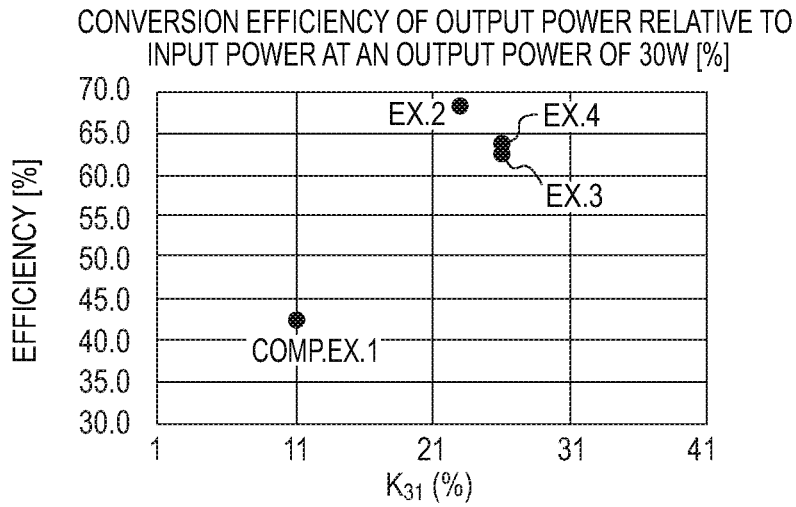
Figure 8C:
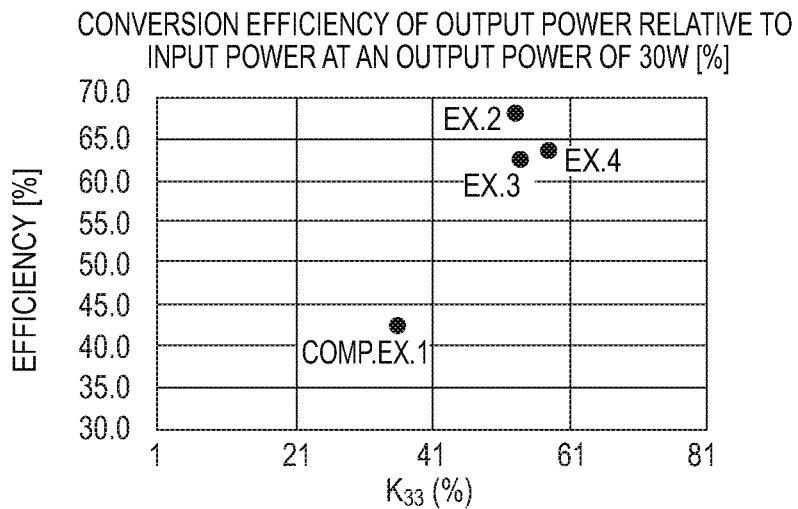

FIGS. 7 and 8A through 8C schematically illustrate the results of the evaluations of the characteristics of the piezoelectric transformers in Comparative Example 1 and Examples 1 through 4. More specifically, FIG. 7 schematically illustrates the conversion efficiency of each of the piezoelectric transformers as determined from the output power and the input power and FIG. 8A illustrates the conversion efficiency of each of the piezoelectric transformers as determined from the output power and the input power when the output power was 10 W, while FIGS. 8B and 8C illustrate the conversion efficiency of each of the piezoelectric transformers as determined from the output power and the input power when the output power was 30 W.

From the results illustrated in FIGS. 7 and 8A through 8C, it will be seen that the piezoelectric transformers of Examples 1 through 4 are advantageous relative to the piezoelectric transformer of Comparative Example 1 whose ratio of the electromechanical coupling coefficients ($k_{33}/k_{31}$) of the piezoelectric ceramics was 1.8 in terms of conversion efficiency as will be described below. Namely, the ratio of the electromechanical coupling coefficients ($k_{33}/k_{31}$) of piezoelectric ceramics of the piezoelectric transformer of each of Examples 1 through 4 was not lower than 2.0 and hence the conversion efficiency as determined from the output power and the input power of the piezoelectric transformer was higher than that of the piezoelectric transformer of Comparative Example 1.

By comparing Example 1 with Examples 2 through 4, it will be seen that the electromechanical coupling coefficients $k_{31}$ of the piezoelectric ceramics of each of Examples 2 through 4 satisfied the requirement of being less than 30% and not less than 50%. Thus, as seen from FIGS. 8B and 8C, the conversion efficiency as determined from the input power and the output power of each of Examples 2 through 4 was higher than that of Example 1 even for high output power of not lower than 30 W.

On the other hand, by comparing Examples 2 through 4, it will be seen that the descending order of the ratios of the electromechanical coupling coefficients $k_{33}/k_{31}$ of the piezoelectric ceramics of Examples 2 through 4 agreed with the descending order of the conversion efficiencies as determined from the input powers and the output powers of the piezoelectric transformers of Examples 2 through 4. More specifically, the conversion efficiency of Example 4 was higher than that of Example 3 and the conversion efficiency of Example 2 was higher than that of Example 4.

The power conversion efficiency of Example 5 whose piezoelectric transformer had structure 2 was 89% when the output power was 10 W and 85% when the output power was 30 W, while the power conversion efficiency was 82% when the output power was 50 W. By comparing Example 5 with Example 2, they differed from each other in that a third member was arranged between the input section and the output section of Example 5. In Example 2, the center of the first piezoelectric element (the piezoelectric element for input) was made to be the position where the stress was maximized. In Example 5, on the other hand, a high conversion efficiency was realized by making both the center of the first piezoelectric element (the piezoelectric element for input) and the center of the second piezoelectric element (the piezoelectric element for output) to be the positions where the stress was maximized.

Figure 2E:
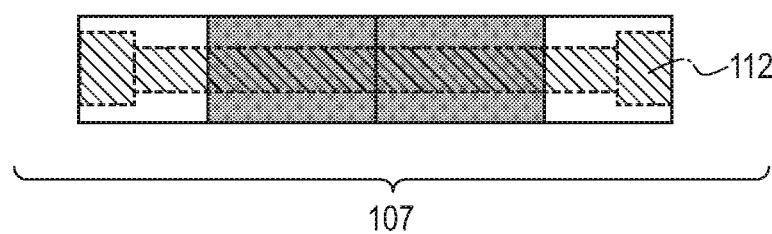

A piezoelectric transformer was formed by modifying the structure of the piezoelectric transformer of Example 5 such that the first member and the second member, both of which were made of SUS, were provided with respective recesses and nuts were buried in the recesses as shown in FIG. 2E. Additionally, the input section and the output section of the piezoelectric transformer were arranged at respective positions where the stress was maximized at the time of stretching vibrations. The piezoelectric characteristics of the piezoelectric transformer were evaluated just like the evaluation of the piezoelectric transformers of Examples 1 through 5 to find that the conversion efficiency of this piezoelectric transformer as determined from the output power and the input power of the piezoelectric transformer was substantially the same as that of the piezoelectric transformer of Example 5. However, this piezoelectric transformer allowed downsizing because the pressurizing mechanism was buried in the first member and the second member.

While SUS was employed for the third member of structure 2, the material of the third member is not limited to metal but an insulator can alternatively be employed for the third member. When the third member is made to be an insulator, the input side circuit and the output side circuit can be insulated from each other in the structure of the piezoelectric transformer. Such an insulated structure can prevent the electricity at the input side from directly flowing into the output side so that the circuit or circuits connected to the output side is or are securely protected. Additionally, any situation where the electricity at the output side is unexpectedly made to flow back to the input side is prevented from taking place.

When a piezoelectric transformer of the present disclosure is put to use, the generation of heat along the interface between each of the piezoelectric ceramics and the peripheral members such as the electrode plates and the metal pillars is minimized to realize a high power conversion efficiency performance A piezoelectric transformer of the present disclosure can be utilized for an electronic apparatus designed to comprise a piezoelectric transformer.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-195965, filed Oct. 17, 2018, which is hereby incorporated by reference herein in its entirety.

What is claimed is:

1. A piezoelectric transformer comprising at least:
a laminate of a first member, a first piezoelectric element, a second piezoelectric element and a second member sequentially stacked in this order; and
a pressurizing mechanism for squeezing the first member and the second member of the laminate together in the stacking direction;
a ratio of the electromechanical coupling coefficient $k_{33}$ relative to the electromechanical coupling coefficient $k_{31}$ ($k_{33}/k_{31}$) of the first piezoelectric element and the second piezoelectric element being not less than 2.0.

2. The piezoelectric transformer according to claim 1, wherein
the Young's modulus of the first piezoelectric element and the second piezoelectric element at room temperature is not less than 100 GPa and not more than 200 GPa.

3. The piezoelectric transformer according to claim 1, wherein
a content rate of Pb component contained in the first piezoelectric element and the second piezoelectric element is less than 1,000 ppm.

4. The piezoelectric transformer according to claim 1, wherein
each of the first piezoelectric element and the second piezoelectric element includes electrodes and piezoelectric ceramics and the piezoelectric ceramics are formed by using perovskite-type metal oxides.

5. The piezoelectric transformer according to claim 4, wherein
the piezoelectric ceramics contain Ba and Ti.

6. The piezoelectric transformer according to claim 5, wherein
the piezoelectric ceramics additionally contain Ca and Zr.

7. The piezoelectric transformer according to claim 6, wherein
a molar ratio x of Ca relative to the sum of Ba and Ca is $0.02 \leq x \leq 0.30$; and
a molar ratio y of Zr relative to the sum of Ti and Zr is $0.020 \leq y \leq 0.095$;
a relationship between x and y being $y \leq x$.

8. The piezoelectric transformer according to claim 4, wherein
the piezoelectric ceramics are made of a piezoelectric material containing Mn; and
the Mn content ratio relative to 100 parts by weight of the oxides is not less than 0.02 parts by weight and not more than 0.40 parts by weight in terms of metallic Mn.

9. The piezoelectric transformer according to claim 4, wherein
the piezoelectric ceramics contain Na and Nb.

10. The piezoelectric transformer according to claim 1, wherein
a third member is laid between the first piezoelectric element and the second piezoelectric element.

11. The piezoelectric transformer according to claim 1, wherein
the pressurizing mechanism is made to run through the laminate.

12. The piezoelectric transformer according to claim 1, wherein
the pressurizing mechanism is buried in the laminate.

13. The piezoelectric transformer according to claim 1, wherein
each of the piezoelectric elements is formed by stacking an even number of plate-shaped piezoelectric ceramics and a plurality of electrodes.

14. The piezoelectric transformer according to claim 10, wherein
the third member is an insulator.

15. An electronic apparatus comprising a piezoelectric transformer according to claim 1 and a drive circuit for supplying an alternating voltage to the piezoelectric transformer.

16. A piezoelectric transformer comprising at least:
a laminate of a first member, a first piezoelectric element, a second piezoelectric element and a second member sequentially stacked in this order; and
a pressurizing mechanism for squeezing the first member and the second member of the laminate together in the stacking direction;
the electromechanical coupling coefficient $k_{31}$ of the first piezoelectric element and the second piezoelectric element being less than 30%, the electromechanical coupling coefficient $k_{33}$ of the first piezoelectric element and the second piezoelectric element being not less than 50%.

17. The piezoelectric transformer according to claim 16, wherein
a ratio of the electromechanical coupling coefficient $k_{33}$ relative to the electromechanical coupling coefficient $k_{31}$ ($k_{33}/k_{31}$) of the first piezoelectric element and the second piezoelectric element is not less than 2.0.

* * * * *